United States Patent
Chen et al.

(10) Patent No.: US 7,228,887 B2
(45) Date of Patent: Jun. 12, 2007

(54) RADIATOR STRUCTURE

(75) Inventors: Chiang-Han Chen, Taipei (TW); Hung-Chin Liao, Taipei (TW); Min-Hsun Shen, Taipei (TW)

(73) Assignee: Asia Vital Component Co., Ltd., Kaohsiung (TW)

( * ) Notice: Subject to any disclaimer, the term of this patent is extended or adjusted under 35 U.S.C. 154(b) by 148 days.

(21) Appl. No.: 11/062,791

(22) Filed: Feb. 23, 2005

(65) Prior Publication Data

US 2006/0185820 A1    Aug. 24, 2006

(51) Int. Cl.
*F28F 21/08*    (2006.01)
(52) U.S. Cl. .................... 165/80.3; 165/185
(58) Field of Classification Search .......... 165/80.2, 165/80.3, 185; 361/704; 257/722
See application file for complete search history.

(56) References Cited

U.S. PATENT DOCUMENTS

| | | | | |
|---|---|---|---|---|
| 4,283,464 A | * | 8/1981 | Hascoe | 428/594 |
| 4,408,659 A | * | 10/1983 | Hermanns et al. | 165/10 |
| 5,542,471 A | * | 8/1996 | Dickinson | 165/170 |
| 5,944,097 A | * | 8/1999 | Gungor et al. | 165/185 |
| 6,758,263 B2 | * | 7/2004 | Krassowski et al. | 165/185 |
| 6,821,625 B2 | * | 11/2004 | Chu et al. | 428/408 |
| 6,898,084 B2 | * | 5/2005 | Misra | 361/710 |
| 2002/0043364 A1 | * | 4/2002 | Suzuki et al. | 165/185 |
| 2002/0054480 A1 | * | 5/2002 | Jitaru | 361/704 |
| 2003/0188848 A1 | * | 10/2003 | Kuo | 165/80.3 |
| 2004/0065432 A1 | * | 4/2004 | Smith et al. | 165/80.2 |
| 2004/0134646 A1 | * | 7/2004 | Chu et al. | 165/185 |
| 2005/0039885 A1 | * | 2/2005 | Vaidyanathan et al. | 165/80.4 |
| 2005/0155752 A1 | * | 7/2005 | Larson et al. | 165/185 |

* cited by examiner

*Primary Examiner*—Teresa J. Walberg

(57) ABSTRACT

A radiator structure includes a base and conductive components. Several fins extend from the base and the conductive components are arranged in the base and the fins in a way of being distributed in orderly pieces in the base and the fins. The base and the fins are made of a metallic material with better heat dissipation rate and the conductive components are made of a metallic material with better heat conductivity so that integral heat dissipation efficiency of the radiator is enhanced largely.

4 Claims, 6 Drawing Sheets

RADIATOR STRUCTURE

BACKGROUND OF THE INVENTION

1. Field of the Invention

The present invention is related to a radiator structure and particularly to a radiator structure combining different metals.

2. Brief Description of the Related Art

Due to high technology developing progressively and prosperously, it leads to the electronic component such as CPU can be made much smaller in size to achieve approach of miniaturization with higher intensity per unit area and enhanced capability. However, a side effect along with the preceding advantages to the extremely miniaturized electronic component is gross heat being generated much more than before. Thus, if there is no good way being introduced for removing the heat, excessively high temperature results in phenomenon such as thermal runaway and thermal stress to lower integral steadiness and shorten the life span of the electronic component. Hence, how to dissipate high temperature heat from the overheated electronic component is a subject has to be cared indispensably.

Generally, there are four popular cooling ways: 1.forced-air cooling; 2.natural cooling; 3.phase change cooling and 4.liquid cooling directly or indirectly. Mostly, the forced-air cooling in association with a radiator is popularly used for achieving cooling effect. The radiator provides fins to assist the electronic component dissipating heat because the fins increases heat dissipation area of the electronic component. Further, the fin type air-cooling radiator adopts air as the working medium, which is easy to be acquired steadily and it won't hurt the electronic component. In addition, the radiator basically is made of aluminum and copper, which are low cost and high heat dissipation coefficient. Moreover, aluminum and copper are easy to be worked so that the radiator can be fabricated well in association with optimum design of geometry for solving the problem of heat dissipation of the electronic component.

Conventionally, the radiator is made of extruded aluminum but aluminum provides poor conductivity in spite of fast heat dissipation. Under this circumstance, the high temperature heat from the electronic component is unable to transmit rapidly via the aluminum radiator so that it is ineffective while the aluminum radiator is in operation for heat removal. As for copper radiator, it has better heat conductivity but poorer heat dissipation rate. Further, the copper radiator needs higher production technique while in fabrication and it leads to high overall production cost and selling price so that it is hard for the user to afford the copper radiator.

Thus, in order to combine properties of fast heat dissipation offered by aluminum and fast heat conduction offered by copper, a radiator with aluminum and copper is fabricated as shown in FIG. 1, that is, an aluminum part 11 and a copper part 12 are provided to be closely adjacent to each other. The aluminum part 11 has several fins 13 extending outward and the copper part 12 closely contacts with the electronic component 14 so that heat from the electronic component 14 can be transmit rapidly by the copper part 12 and removed outward via the aluminum part 11 and the fins 13.

Alternatively, an aluminum part 21 and a copper part 22 are provided as shown in FIG. 2 and the aluminum part 21 has a recess 211 at the middle thereof for receiving the copper part 22, which has the same shape and size as the recess 211. The aluminum part 21 has several fins 23 extending outward. The copper part 22 closely contacts the electronic component 24 so that heat from the electronic component 24 can be transmitted via the copper part 22 to the aluminum part 21 and the fins 23 respectively rapidly before removal.

Referring to FIGS. 3 and 4, an aluminum part 31 is hollow post with a through hole 311 and a plurality of fins 33 extending radially from the circumferential side thereof. A copper part 32 tightly fits with the through hole 311 to allow the lower end of the copper part 32 closely contacting an electronic component 34. The heat from the electronic component 34 can be transmitted to the aluminum part 31 and the fins 33 via the copper part 32 rapidly before dissipating outward.

However, a common problem in the preceding three conventional radiators is in that the copper part 12, 22, 32 centralizes at a preset zone and heat aggregates at the aluminum part 11, 21, 31 and a little section of the aluminum part 11, 21, 31 adjacent to the copper part 12, 22, 32 such that heat is incapable of distributing to the fins 13, 23, 33 effectively. In other words, the heat is unable to distribute evenly to the entire radiator and it means the heat dissipation is still not enhanced effectively.

Moreover, the aluminum part 11, 21, 31 and the copper part 12, 22, 32 are different in the specific weight and it is easy for the aluminum part 11, 21, 31 to separate from the copper part 12, 22, 32 such that it results in the conventional bimetal radiator having a shortened life span.

SUMMARY OF THE INVENTION

A primary object of the present invention is to provide a radiator structure, which includes a plurality of conductive components being separately arranged in a base and a plurality of fins extending from the base in a way of the conductive components being distributed in the entire base and the fins and material of the respective conductive component providing heat conductivity better than that of the base and the fins so as to enhance heat dissipation efficiency of the radiator.

Another object of the present invention is to provide a radiator structure in which the conductive components are arranged to distribute in the base and the fins and have a shape of a strip, a sheet or a net respectively to increase cooling area and perform heat conduction evenly and heat removal rapidly.

Accordingly, a radiator structure according to the present invention includes a base, several fins extending from the base and a plurality of conductive components. The conductive components are separately arranged in the base and the fins. The base and the fins are made of a metallic material with heat dissipation rate better than that of the conductive components, which are made of a metallic material with heat conductivity being better than that of the base and the fins, so that the integral heat conduction with dissipation efficiency is enhanced largely.

The conductive components are inserted or embedded insides and/or surfaces of the base and the fins in a way of spacing apart from each other in parallel or non-parallel.

BRIEF DESCRIPTION OF THE DRAWINGS

The detail structure, the applied principle, the function and the effectiveness of the present invention can be more fully understood with reference to the following description and accompanying drawings, in which.

DETAILED DESCRIPTION OF THE INVENTION

Figure 1:
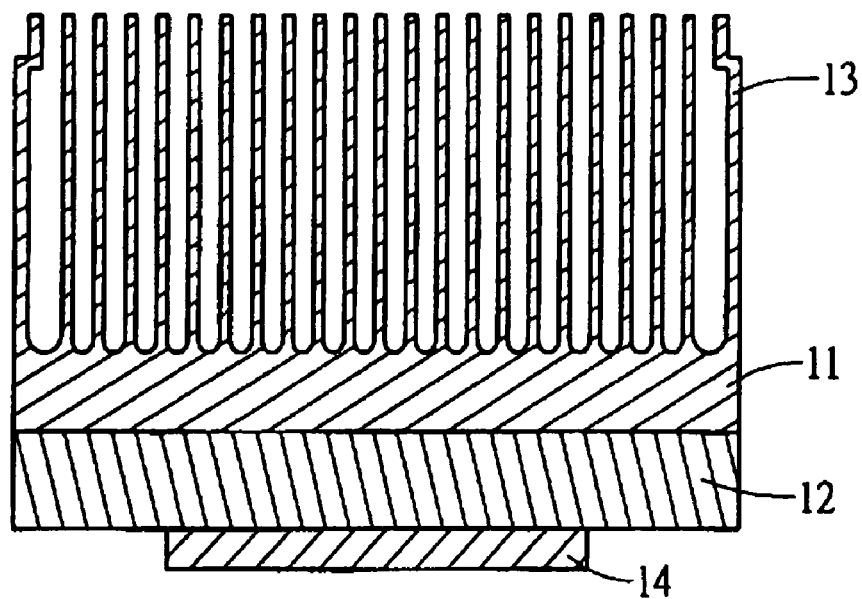
FIG. 1 is a sectional view of the first type of the conventional radiator structure.
Figure 2:
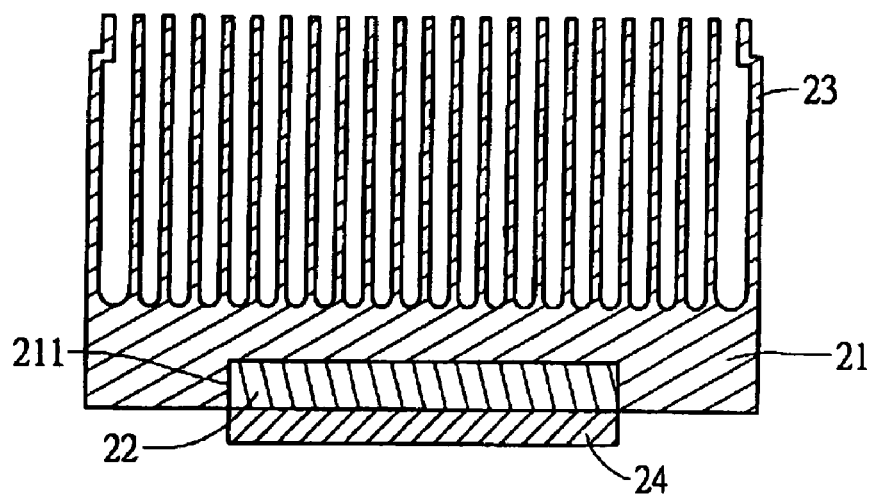
FIG. 2 is a sectional view of the second type of the conventional radiator structure.
Figure 3:
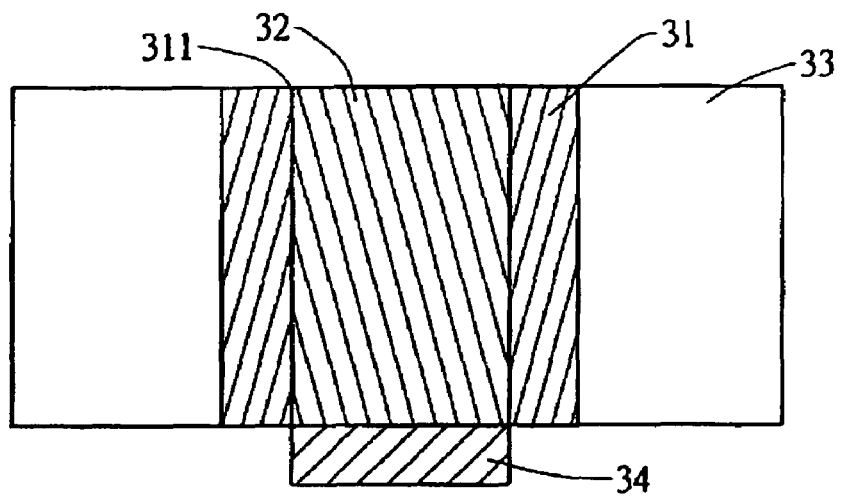
FIG. 3 is a sectional view of the third type of the conventional radiator structure.
Figure 4:
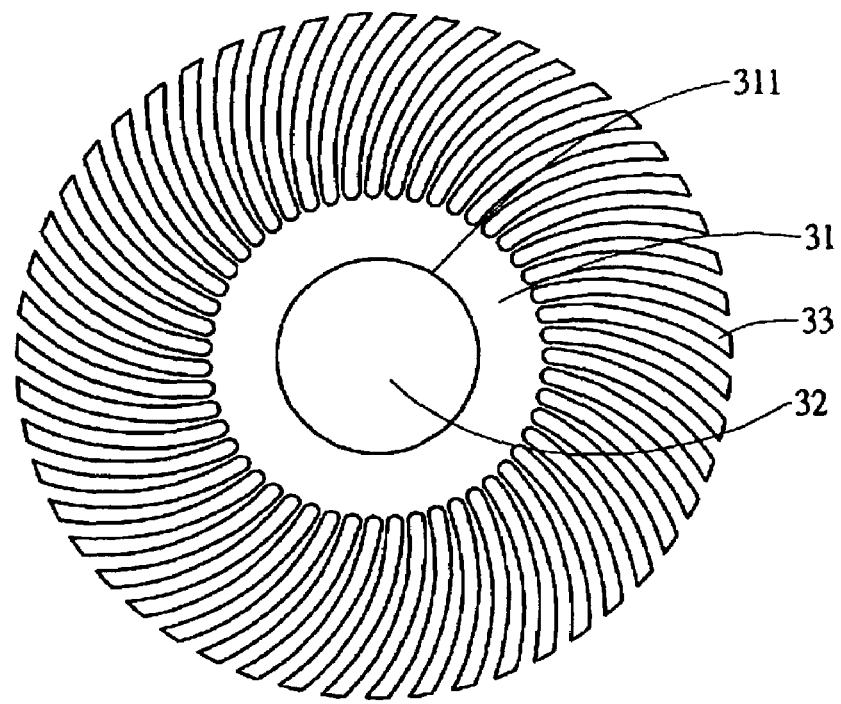
FIG. 4 is a top view of the third type of the conventional radiator structure.
Figure 5:
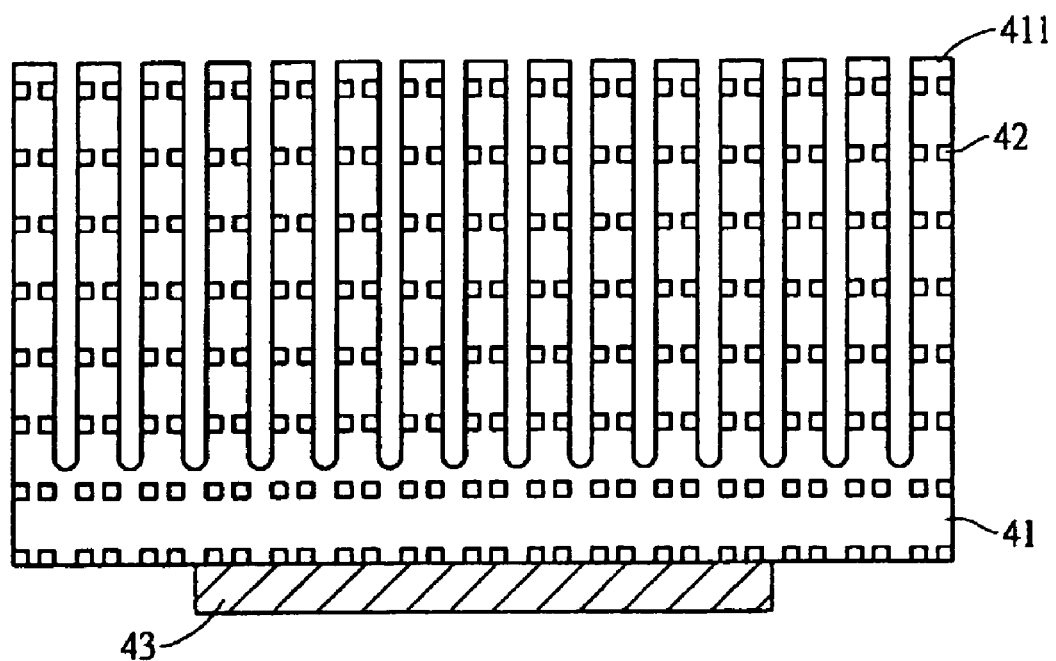
FIG. 5 is a front view of a preferred embodiment of the radiator structure according to the present invention.
Figure 6:
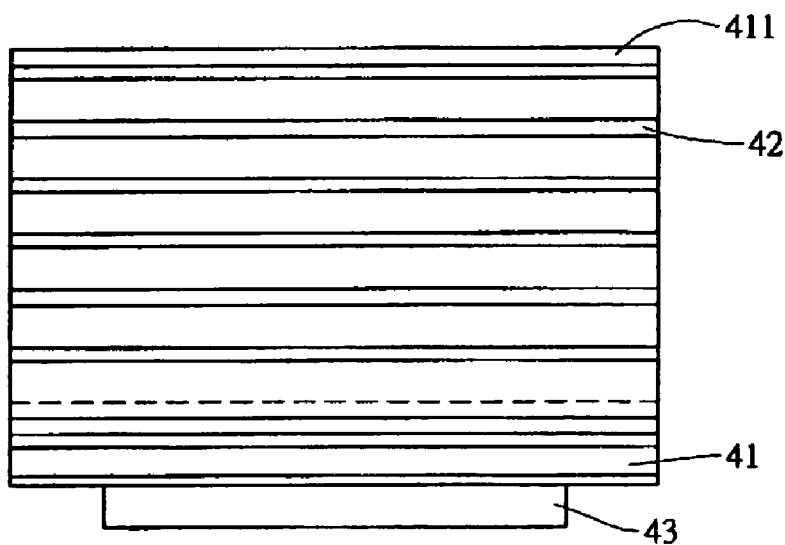
FIG. 6 is a side view of the preferred embodiment of the radiator structure according to the present invention.

Referring to FIGS. 5 and 6, the preferred embodiment of a radiator structure according to the present invention includes a base 41 with a plurality of extending out fins 411 and a plurality of conductive components 42. The conductive components 42 are joined to the base 41 and the fins 411. Preferably, the conductive component 42 is joined to interiors and/or surfaces of the base 41 and the fins 411 in a way of fitting with or embedded in the base 41 and the fins 411. That is, the respective conductive component 42 is located at all both the base 41 and the fins 411. It can be seen in FIG. 5 that the conductive components 42 are provided with a bar shape respectively and arranged to embed in the base 41 and the fins 411 in a way of being orderly to space apart from each other in parallel. Alternatively, the bar shaped conductive components can be arranged in non-parallel or to intersect to each other. Further, FIGS. 5 and 6 show the conductive components 42 are disposed to have an elongated side being in accordance with a lateral side of the fins 411 and the base 41 respectively in addition to being embedded in the base 41 and the fins 411. The conductive components 42 are made of a material different from the base 41 and the fins 411, i.e., the base 41 and the fins 411 are made of a first metal, which has better heat dissipation rate and the conductive components 42 are made of a second metal, which has better heat conductivity.

Figure 7:
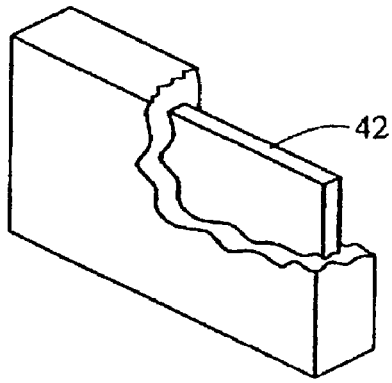
FIG. 7 is a perspective view illustrating another type of conductive component according to the present invention.
Figure 8:
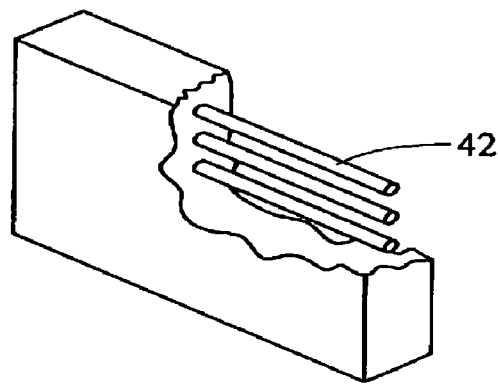
FIG. 8 is a perspective view illustrating a further type of conductive component according to the present invention.
Figure 9:
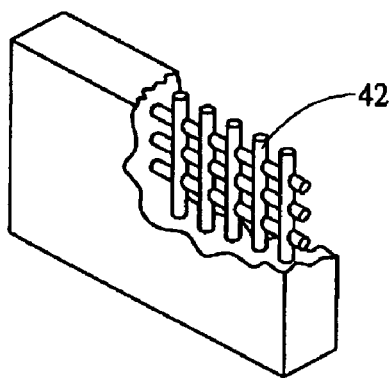
FIG. 9 is a perspective view illustrating a further type of conductive component according to the present invention.
Figure 10:
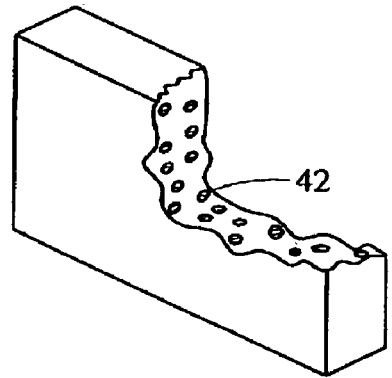
FIG. 10 is a perspective view illustrating a further type of conductive component according to the present invention.
Figure 11:
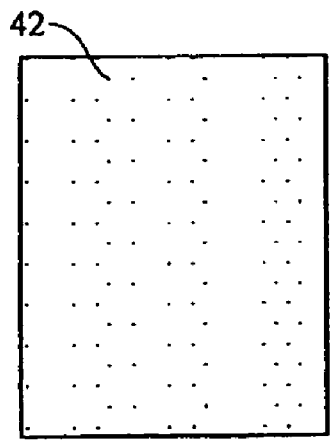
FIG. 11 is a plan view illustrating a further type of conductive component according to the present invention.
Figure 12:
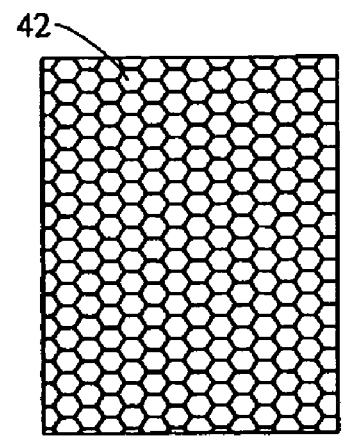
FIG. 12 is a plan view illustrating a further type of conductive component according to the present invention.
Figure 13:
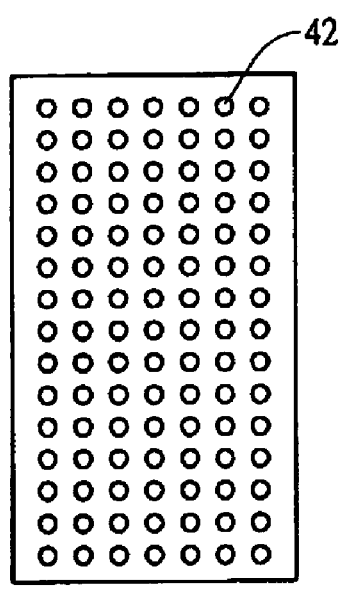
FIG. 13 is a plan view illustrating a further type of conductive component according to the present invention.
Figure 14:
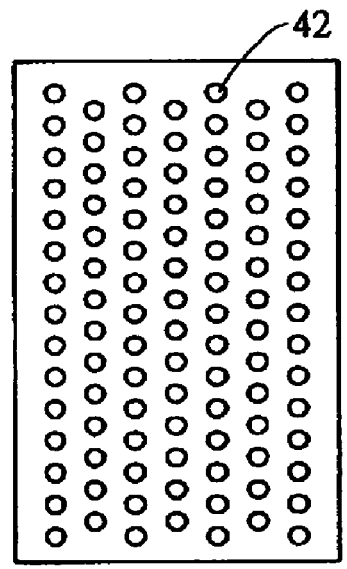
FIG. 14 is a plan view illustrating a further type of conductive component according to the present invention.
Figure 15:
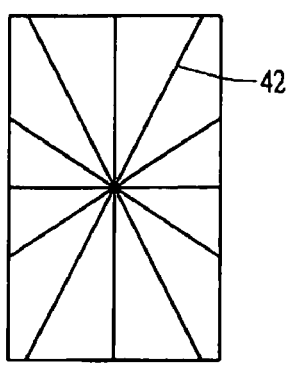
FIG. 15 is a plan view illustrating a further type of conductive component according to the present invention.
Figure 16:
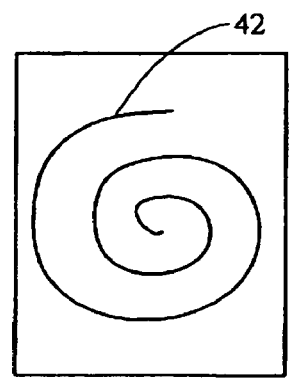
FIG. 16 is a plan view illustrating a further type of conductive component according to the present invention.
Figure 17:
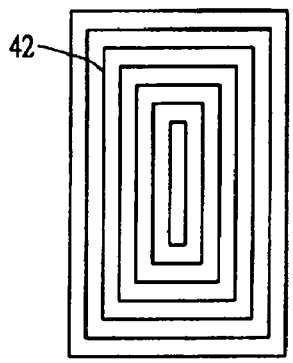
FIG. 17 is a plan view illustrating a further type of conductive component according to the present invention.
Figure 18:
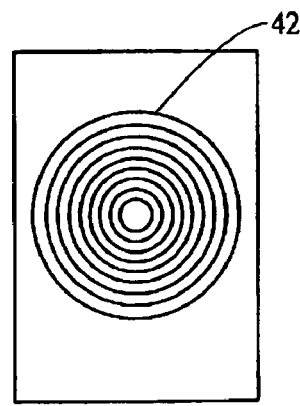
FIG. 18 is a plan view illustrating a further type of conductive component according to the present invention.
Figure 19:
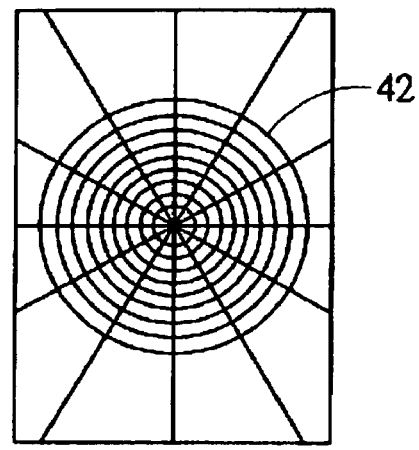
FIG. 19 is a plan view illustrating a further type of conductive component according to the present invention.

The conductive components 42 can be formed with a shape of sheet as shown in FIG. 7, a plurality of parallel rod as shown in FIG. 8, a net as shown in FIG. 9, a plurality of grains as shown in FIGS. 10 and 11, a honeycomb as shown in FIG. 12, a point matrix as shown in FIGS. 13 and 14, radial bars or sheets as shown in FIG. 15, a spiral shaped strip as shown in FIGS. 16 and 17, concentric circular bars or strips as shown in FIG. 18, a shape of cobweb as shown in FIG. 19 or irregular geometry (not shown). Further, conductivity efficiency of the second metal is higher than the first metal. For example 1, in case of the first metal material being aluminum, the second metal material is gold, silver or copper or a conductive material with a coefficient of conductivity better than the first metal material. For example 2: in case of the first metal material being copper, the second metal material is gold or silver. The first metal material and the second metal material are not limited to the preceding material and other materials can be used for obtaining the same effect.

When the base 41 is closely attached to an electronic component 43, most part of heat generated by the electronic component 43 is transmitted rapidly with the conductive components 42 and remainder of the heat is conducted via the base 41 and the fins 411. The heat transmitted by the conductive components 42 is further dissipated outward with the base 41 and the fins 411. That is, all the heat from the electronic component 43 can be transmitted to the entire radiator much faster with help of the conductive components 42 before being removed rapidly with the base 41 and the fins 411. Further, an external device such as fan (not shown) is employed to perform forcing convection for enhancing heat exchange between cool air and the fins 411 during the radiation is in operation to promote heat dissipation efficiency substantively. The conductive components 42 being distributed in the interior and/or the surfaces of the base 41 and the fins 411 means the heat conduction area being increased and it is much helpful for function of the radiator. In this way, deficiency of the prior art regarding heat congregating at the copper material and being incapable of transmitting to aluminum material consistently can be overcome significantly.

While the invention has been described with referencing to preferred embodiments thereof, it is to be understood that modifications or variations may be easily made without departing from the spirit of this invention, which is defined by the appended claims.

What is claimed is:

1. A radiator structure comprising:
   a base and
   a plurality of fins extending from the base;
   characterized in that a plurality of elongated conductive components are embedded in the base and the fins in a way of being distributed evenly with orderly arrangement of spacing apart a distance from each other such that part of the conductive components have a lateral side thereof being flush with a lateral side of the base and the fins respectively; and the conductive components have heat conductivity better than the base and the fins.

2. The radiator structure as defined in claim 1, wherein the conductive components have a rod shape respectively.

3. The radiator structure as defined in claim 1, wherein the conductive components have a shape of spiral respectively.

4. The radiator structure as defined in claim 1, wherein the conductive components form a plurality of concentric circular shapes.

* * * * *